US011017843B2

(12) United States Patent
Sharma et al.

(10) Patent No.: US 11,017,843 B2
(45) Date of Patent: May 25, 2021

(54) THIN FILM TRANSISTORS FOR MEMORY CELL ARRAY LAYER SELECTION

(71) Applicant: Intel Corporation, Santa Clara, CA (US)

(72) Inventors: Abhishek Sharma, Hillsboro, OR (US); Gilbert Dewey, Hillsboro, OR (US); Willy Rachmady, Beaverton, OR (US); Van Le, Beaverton, OR (US); Matthew Metz, Portland, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 16/457,617

(22) Filed: Jun. 28, 2019

(65) Prior Publication Data

US 2020/0411078 A1    Dec. 31, 2020

(51) Int. Cl.
| | | |
|---|---|---|
| *G11C 11/24* | (2006.01) | |
| *G11C 11/4091* | (2006.01) | |
| *H01L 27/108* | (2006.01) | |
| *H01L 27/12* | (2006.01) | |
| *G11C 11/4094* | (2006.01) | |
| *G11C 11/408* | (2006.01) | |

(52) U.S. Cl.
CPC ...... *G11C 11/4091* (2013.01); *G11C 11/4085* (2013.01); *G11C 11/4094* (2013.01); *H01L 27/10814* (2013.01); *H01L 27/10897* (2013.01); *H01L 27/124* (2013.01); *H01L 27/1222* (2013.01); *H01L 27/1225* (2013.01); *H01L 27/1255* (2013.01)

(58) Field of Classification Search
CPC ............ G11C 11/4091; G11C 11/4085; G11C 11/4094; H01L 27/10814; H01L 27/10897; H01L 27/1222; H01L 27/124; H01L 27/1255
See application file for complete search history.

(56) References Cited

U.S. PATENT DOCUMENTS

| | | | |
|---|---|---|---|
| 2010/0061170 A1* | 3/2010 | Kajigaya | G11C 11/4097 365/207 |
| 2013/0070506 A1* | 3/2013 | Kajigaya | H01L 27/2436 365/51 |
| 2018/0114578 A1* | 4/2018 | Ishizu | G11C 11/401 |
| 2019/0393223 A1* | 12/2019 | Sharma | G11C 11/4096 |

\* cited by examiner

*Primary Examiner* — Toan K Le

(74) *Attorney, Agent, or Firm* — Green, Howard & Mughal LLP

(57) ABSTRACT

In memory devices where a memory cell includes a thin film cell select transistor, selection between layers of such memory cells may further comprise another thin film select transistor. Bitline and wordline encoding suitable for a memory device having a single layer of memory cells may be scaled up to a 3D memory device having two or more memory cell layers. In a DRAM device one layer of (1TFT-1C) cells may include a 2D array of metal-insulator-metal capacitors over an array of TFTs. Additional layers of such 1TFT-1C cells may be stacked monolithically to form a 3D array. Memory cells in each layer may be accessed through a wordline and local bitline. A local bitline of one cell layer may be coupled to global bitline applicable to all cell layers through a layer-selected TFT according to a voltage applied to a layer-select gate voltage.

20 Claims, 9 Drawing Sheets

THIN FILM TRANSISTORS FOR MEMORY CELL ARRAY LAYER SELECTION

BACKGROUND

Embedded memory may be monolithically integrated with a host IC (i.e., both memory and the host IC fabricated on the same chip). For embedded memory applications, reducing the overall memory array footprint helps achieve larger memories and/or reduce device cost. One form of embedded memory is embedded dynamic random access memory (eDRAM). The architecture of eDRAM is based on a 1T-1C cell that includes a cell "write" or "select" transistor and a storage capacitor.

The BEOL of an integrated circuit fabrication process is the portion of IC fabrication where individual semiconductor devices (whether embedded memory or logic transistors) may be interconnected to one another with electrically conductive features such as metal interconnect traces (lines) within a given metallization level and metal-filled conductive vias between multiple metallization levels. For some memory devices, a transistor of a memory cell may also be fabricated in the back-end-of-line (BEOL) with the channel material being a thin film semiconductor material rather than the monocrystalline semiconductor (e.g., Si) typical of front-end-of-line (FEOL) transistors. For eDRAM, the capacitor may also be fabricated in the BEOL and electrically coupled to the transistor through one or more metal interconnect layers formed in the BEOL.

Memory cells implemented in the BEOL may be interconnected to peripheral circuitry (e.g., address decoders) implemented in with CMOS logic fabricated in the FEOL. The interconnection however becomes much more difficult if more than one layer of memory cells is implemented in the BEOL. For example, where an IC chip includes two or more memory cell layers, the set of data lines (e.g., 1,024 bitlines) associated with each memory cell array layer would need to be routed down to periphery circuitry. However routing this many lines down from two, three, or more memory array layers would require significant area.

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
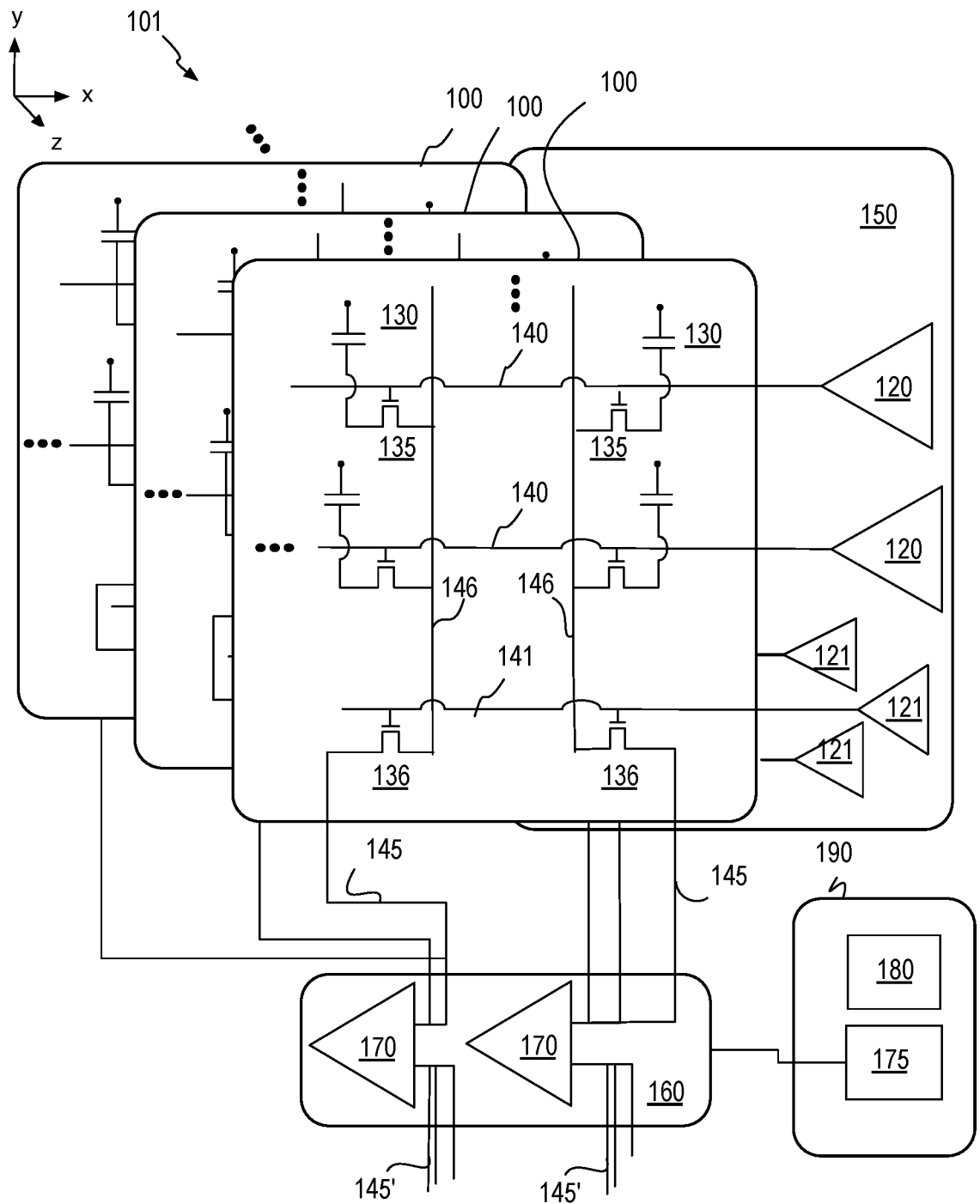
FIG. 1 illustrates a schematic of a multi-layer DRAM device, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Memory devices comprising multiple layers of memory cell arrays are described herein. In a DRAM embodiment, each memory array layer comprises a 2D array of metal-insulator-metal (MIM) capacitors and a 2D array of "cell select" thin film transistors (TFTs). In accordance with some embodiments, a global bitline may be selectively coupled to a local bitline of each layer of the multi-layer memory cell array through one or more "array layer select" TFTs. A signal line of a 2D array may convey an array layer select signal. When selected, local bitlines of the 2D array layer may be coupled through a first terminal of the array layer select TFT to a second terminal of the array layer select TFT. The second terminal of the array layer select TFT may be further coupled to a global bitline, which may be further coupled to a sense amp and/or other peripheral bitline logic circuitry. The TFTs providing wordline and local bitline access to the capacitors, and the TFTs providing global bitline access to local bitlines of each memory cell layer may all reside within one device layer of the IC and may be substantially within the footprint of the memory cell array. Peripheral column circuitry may be coupled to the global bitlines and employ FEOL FETs fabricated over a substrate. Peripheral row circuitry may be coupled to wordlines of the various layers of the multi-layered memory cell array, and may also employ FEOL FETs fabricated over the substrate, for example.

For some exemplary embodiments, both the transistor of a 1T-1C storage cell and the array level select transistor are TFTs rather than a substrate-based silicon-based transistor (e.g., MOSFET). As used herein, TFTs are a class of field-effect transistors (FETs) in which the channel semiconductor material is a deposited thin film rather than a substrate material. Depending on the semiconductor material composition, the thin film deposition processes employed in TFT fabrication can be relatively low (e.g., below 450° C.), allowing may levels of such TFTs to be inserted within layers of interconnect metallization of the type that is typically formed only after higher-temperature processing is completed in conventional silicon MOSFET fabrication technology.

FIG. 1 illustrates a 3D spatial schematic of an integrated circuit memory device 101 suitable for DRAM applications, in accordance with some exemplary embodiments. Memory device 101 may have any storage capacity (i.e., any number of bit cells) and one or more memory device 22 may be fabricated on a single IC chip. For any memory device storage capacity, memory device 101 may enable a memory density improvement by including multiple layers of memory cell arrays. A memory device architecture employing a multi-layered memory cell array enables vertical integration of storage elements. A gain in memory density is then possible if the multi-layer memory cell array does not overwhelmingly increase the memory device footprint beyond that of a device employing only single layer memory cell array. In the illustrated example, there three memory cell array layers 100 spatially arranged into a vertical stack (e.g., z-dimension). A 3D memory cell array may include any number of such layer.

Each memory cell array layer 100 includes a 2D array of state storage elements and element (cell) selectors. In the illustrated DRAM example, the storage elements are electrical capacitors 130 and the cell selectors are select transistors 135. Other memory technologies may employ alternative storage elements and/or alternative element selectors within each cell.

Within a memory cell array level 100, memory cells are interconnected into a network with conductive traces including local bitlines 146, and wordlines 140. Bitlines 146 extend in a first direction (e.g., y-dimension), and wordlines 140 extend in a second, orthogonal direction (e.g., x-dimension). Cell select transistor 135 includes one terminal (e.g., drain) that is electrically coupled to each storage capacitor 130, and another terminal (e.g., source) coupled to a local bitline 146. In exemplary embodiments, where each memory cell layer 100 is in the backend levels of an IC die, each cell select transistor 135 is advantageously a TFT and each storage capacitor 130 has a metal-insulator-metal (MIM) structure. Hence, all of capacitors 130, bitlines 146, wordlines 140, and select transistors 135 are within, and/or between, various interconnect metallization levels.

Memory device 101 further includes peripheral memory circuitry. Peripheral memory circuitry includes at least column circuitry 160 and row circuitry 150. In exemplary embodiments, at least one of column circuitry 160 and row circuitry 150 is within a footprint of memory cell array layer 100, for example within a device level below all memory array levels 100. In one example, both column circuitry 160 and row circuitry 150 comprise CMOS circuitry implemented within a crystalline substrate material referred to herein as the front-end of an IC chip.

In the example shown, column circuitry 160 is coupled to global bitlines 145. In the illustrated example each global bitline 145 is coupled to an input node of a differential sense amplifier 170. Differential sense amplifier 170 is further coupled to a reference bitline 145', the destination of which depends on the array architecture (e.g., open, folded, twisted, etc.), and is therefore not illustrated in FIG. 1. In some embodiments, sense amplifier 170 comprises MOSFETs fabricated in a region of a monocrystalline semiconductor device layer (e.g., silicon substrate) that is at least partially underlying all memory array levels 100. Memory cell array layer 100 may have any number of columns and any number of sense amplifiers (e.g., equal to the number of columns in cell array layer 100 for an open architecture or, half the number of columns in cell array layer 100 for a folded architecture, etc.). In some embodiments, for example, memory cell array layer 100 includes between 1024 and 4096 bitlines.

In accordance with embodiments herein, global bitlines 145 can be selectably switched between local bitlines 146 of different memory cell array layers 100. The number of global bitlines 145 may therefore be equal to the number of local bitlines 145 according to the size and architecture of one memory cell array layer 100, and independent of the number of memory cell array levels 100. The complexity and/or size of column circuitry 160 therefore need not increase dramatically with an increase in the number of memory cell array levels 100. For example, in a stack of three memory cell array levels 100, column circuitry 160 need only include the number of sense amplifiers 170 sufficient for a single memory cell array layer 100.

In the example shown, global bitline 145 is coupled to a local bitline 146 through a memory cell array layer select transistor 136. In advantageous embodiments, memory cell array layer select transistor 136 is a TFT. Memory cell array layer select transistor 136 may comprise the same thin film semiconductor material as cell select transistor 135, for example. Although memory cell array layer select transistor 136 may have any dimensions, in some embodiments memory cell array layer select transistor 136 has substantially the same dimensions (e.g., channel length and width) as cell select transistor 135. As shown, a first terminal (e.g., drain) of array layer select transistor 136 is coupled to global bitline 145 rather than being coupled to a storage capacitor. Local bitline 146 is connected to a second terminal (e.g., source) of array layer select transistor 136, for example in substantially the same manner local bitline 146 is connected to a corresponding terminal (e.g., source) of cell select transistor 135. The gate terminal of layer select transistor 136 is connected to an array layer select line 141, which is further coupled to a memory cell array layer select driver 121.

Every local bitline 146 of memory cell array layer 100 may be coupled to a global bitline 145 through a layer select TFT in this same manner Memory cell array layer select line 141 is therefore operable to convey a memory cell array layer select signal (voltage) that concurrently connects and disconnects all local bitlines 146 of memory cell array layer 100 to their corresponding global bitlines 145. When so selected, column circuitry 160 is to read bit states from cells within that cell array layer 100. Column circuitry 160 may be multiplexed across layers of a multi-layered 3D memory cell array, for example, by controlling row circuitry 150 at a first time to drive one memory cell array layer select line 141 into an "on" or "selected" state (e.g. high/low voltage) while all other memory cell array layer select lines 141 associated with other memory cell array layers are driven into an "off" or "deselected" state (e.g., low/high voltage). Row circuitry 150 at a second time is to then drive another memory cell array layer select line 141 into an "on" or "selected" state (e.g. high/low voltage) while all other memory cell array layer select lines 141 associated with the remaining memory cell array layers are driven into an "off" or "deselected" state (e.g., low/high voltage).

Row circuitry 150 further includes wordline drivers 120. Worldline driver 120 are each electrically coupled to a corresponding wordline 140. In some embodiments, drivers 120 comprise MOSFETs fabricated in a region of a monocrystalline semiconductor device layer (e.g., silicon substrate) that is at least partially underlying memory array layer 100. Although one memory cell array layer 100 may have any number of rows, in some examples there are between 256 and 1024 wordlines 140, each coupled to a corresponding wordline driver 120. Each wordline driver 120 may include circuitry operable to bias wordlines 140, for example between a negative voltage (e.g., between 0V and −0.5V) sufficient to turn off an n-type transistor, and a positive voltage (e.g., between 0.5V and 2V) sufficient to turn on an n-type transistor.

In some embodiments, row circuitry 150 includes a set of wordline drivers for each memory cell array layer. For example, for three memory cell array layers that each include 256 wordlines, row circuitry 150 may include three sets of wordline drivers 120 (one wordline driver set having 256 drivers for each memory cell array layer), for a total of 768 wordline drivers 120. To access corresponding wordline drivers 120 in the frontend CMOS circuitry, wordlines 140 from various memory cell array levels may be interconnected to their corresponding drivers through staircase electrical routing architecture adjacent to one or two edges of the memory cell array, for example.

In the illustrated embodiments, row circuitry 150 further includes one memory cell array level select line driver 121 for each memory array layer 100 within a multi-layered memory. Each select line driver 121 is coupled to a memory cell array level select line 141 associated with one memory array level 100. In some embodiments, drivers 121 comprise MOSFETs fabricated in a region that is at least partially underlying memory array layer 100 (e.g., within a monocrystalline semiconductor device layer of a silicon substrate). Memory cell array layer select line driver 121 may include circuitry operable to drive a corresponding memory cell array layer select line 141 into an "on" or "selected" state while all other memory cell array layer select line drivers 121 drive corresponding memory cell array layer select lines 141 into an "off" or "deselected" state. In some embodiments, layer select line drivers 121 include circuitry operable to drive layer select lines 141 between a negative voltage (e.g., between 0V and −0.5V) sufficient to turn off an n-type transistor, and a positive voltage (e.g., between 0.5V and 2V) sufficient to turn on an n-type transistor.

Peripheral memory circuitry further includes control circuitry 190. One or more of column circuitry 160, and/or row circuitry 150, and/or memory cell array layer 100 may be electrically coupled to control circuitry 190. Control circuitry 190 may include, for example, various voltage biasing circuits, such as capacitor bias ($V_{cc}/2$) circuitry 180. Control circuitry 190 may also include, for example, various memory management circuitry, such as control logic 175 communicatively coupled into column circuitry 160 and row circuitry 150 so as to permit coordinated operation of, memory cell array level select drivers 121, sense amplifiers 170 and wordline drivers 120. Control circuitry 190 may also be fabricated in a device level that is within the footprint of the stack of memory cell array levels 100. Control circuitry 190 may, for example, also employ MOSFETs fabricated in a region of a monocrystalline semiconductor device layer (e.g., silicon substrate) that is at least partially underlying the stack of memory cell array levels 100.

Figure 2A:
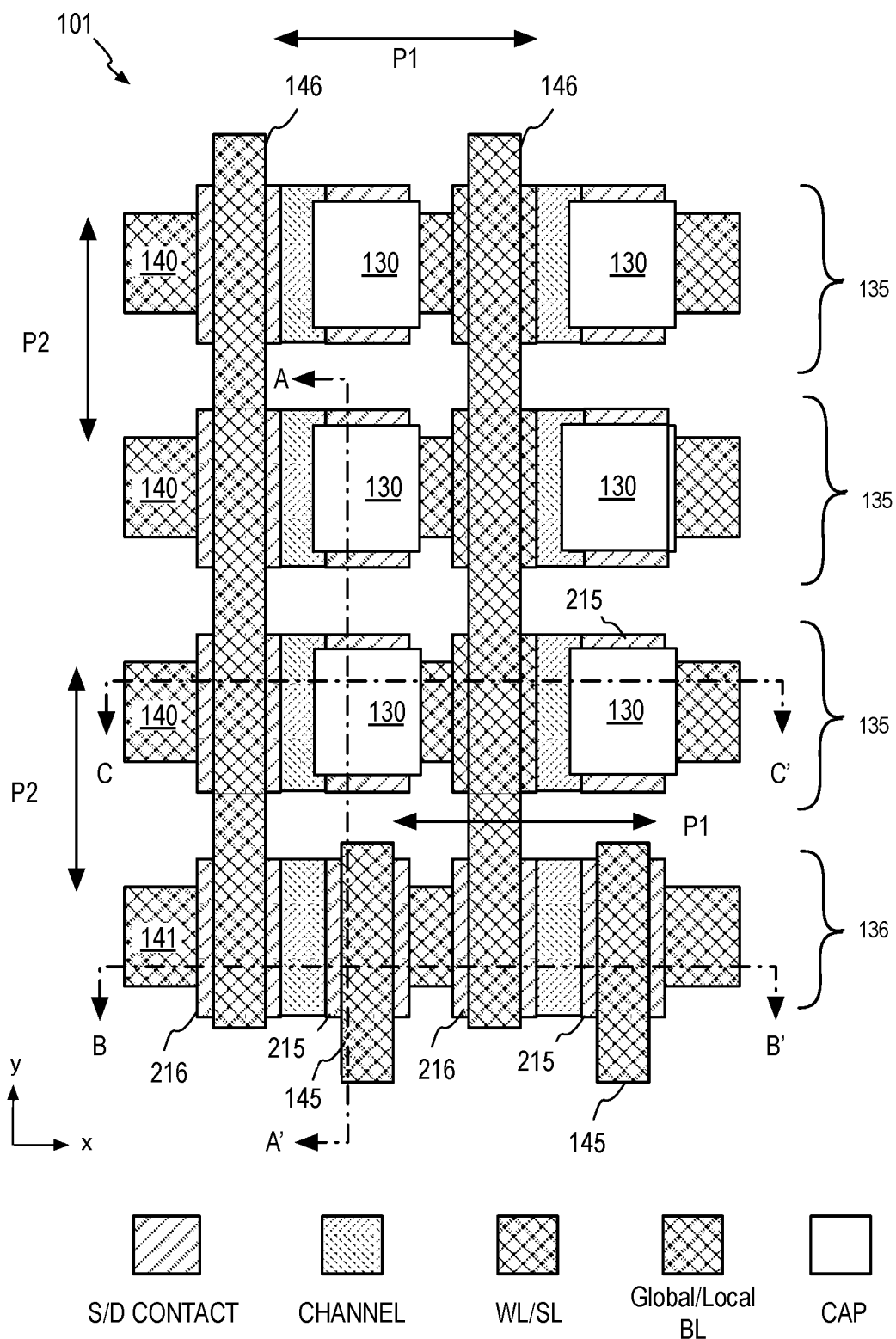
FIG. 2A illustrates a top-down plan view of a DRAM device structure, in accordance with some exemplary embodiments of the memory device structure illustrated in FIG. 1.

FIG. 2A illustrates a top-down plan view of a DRAM memory device structure, in accordance with some exemplary embodiments of the memory device 101. Memory cell array layer select transistors 136 have a layout and interconnection that accommodates their integration within a 2D storage element array. As shown, adjacent memory cell array layer select transistors 136 include terminal (e.g., drain) contacts 215 coupled to adjacent global bitlines 145 having a pitch P1. Memory cell array layer select transistors 136 further include terminal (e.g., source) contacts 216 coupled to adjacent local bitlines 146, which also have a pitch P1. Memory cell array layer select transistors 136 have a gate terminal further coupled to memory cell array layer select line 141 with a conductivity of each select transistor channel then being a function of a voltage level on memory cell array layer select line 141. As noted above, memory cell array layer select line 141 is to be coupled to a memory cell array layer select line driver (or a similar voltage source) operable to bias memory cell array layer select line 141 between a voltage sufficient to turn off layer select transistors 136 and a voltage sufficient to turn on layer select transistors 136.

Local bitlines 146 are further coupled to terminal (e.g., source) contacts of cell select transistors 135. Adjacent cell select transistors 135 are gated through a shared wordline 140. Cell select transistors 135 have substantially the same lateral dimensions as array layer select transistors 136 with both the local and global bitlines having pitch P1, and memory cell array layer select line 141 maintaining a pitch P2 of adjacent wordlines 140. As further illustrated, capacitors 130 are aligned relative to cell select transistors 135 to be connected to one terminal (e.g., drain) contact. In this example, no capacitors 130 are present over memory cell array layer select transistors 136.

For some embodiments, multiple array layer select transistors 136 may be coupled in electrical parallel, for example to provide a lower resistance connection between local and global bitlines. Parallel multi-transistor configurations may be advantageous over single transistor architectures that might require one or more dimensions of an array level select transistor to be larger than those of a storage element select transistor to achieve a given bitline resistance target. Introducing a layer select transistor of greater dimensions than cell select transistors may complicate the layout of 2D TFT array.

Figure 2B:
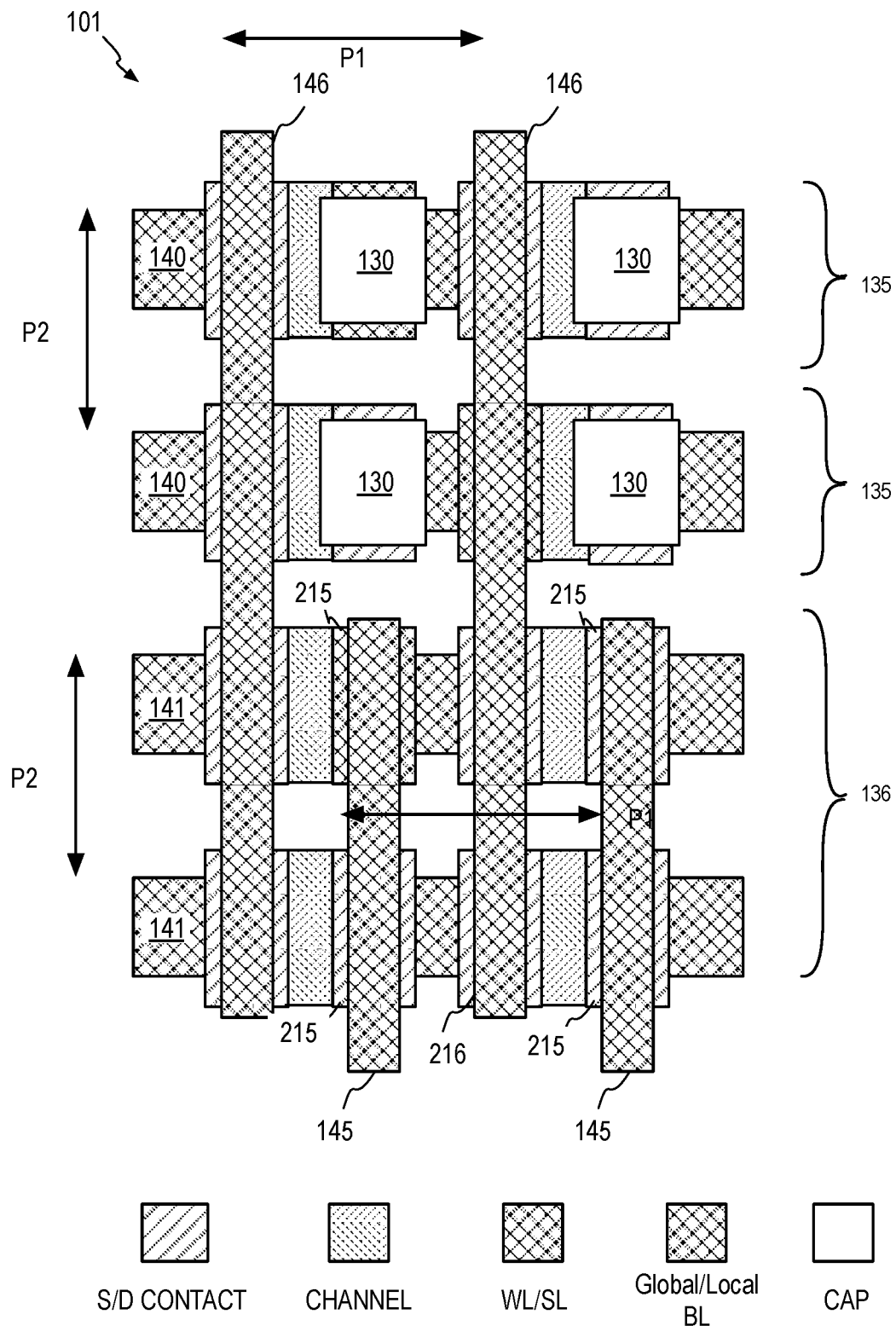
FIG. 2B illustrates a top-down plan view of a DRAM device structure, in accordance with some alternative embodiments of the memory device structure illustrated in FIG. 1.

FIG. 2B illustrates a top-down plan view of an eDRAM memory device structure, in accordance with some alternative embodiments of the memory device 101 where two memory cell array layer select lines 141 are coupled to gate terminals of two rows of array layer select transistors 136. In this example, wordline pitch P2 and bitline (global and local) pitch P1 are again maintained over all thin film select transistors 135 and 136. Global bitline 145 is connected to a terminal (e.g., drain) contact 215 of two layer select transistors 136 that are within a same column. Local bitline 146 is further connected to a terminal (e.g., source) contact 215 of two layer select transistors 136 that are within a same column During operation of a memory device, to select a particular memory cell array level, the pair of memory cell array layer select lines 141 may be driven in electrical parallel by one or more memory cell array layer select line driver. The two rows of memory cell array layer select transistors 136 are concurrently controlled to increase the effective semiconductor channel width through which local bitlines 146 are coupled to their corresponding global bitlines 145.

Figure 3A:
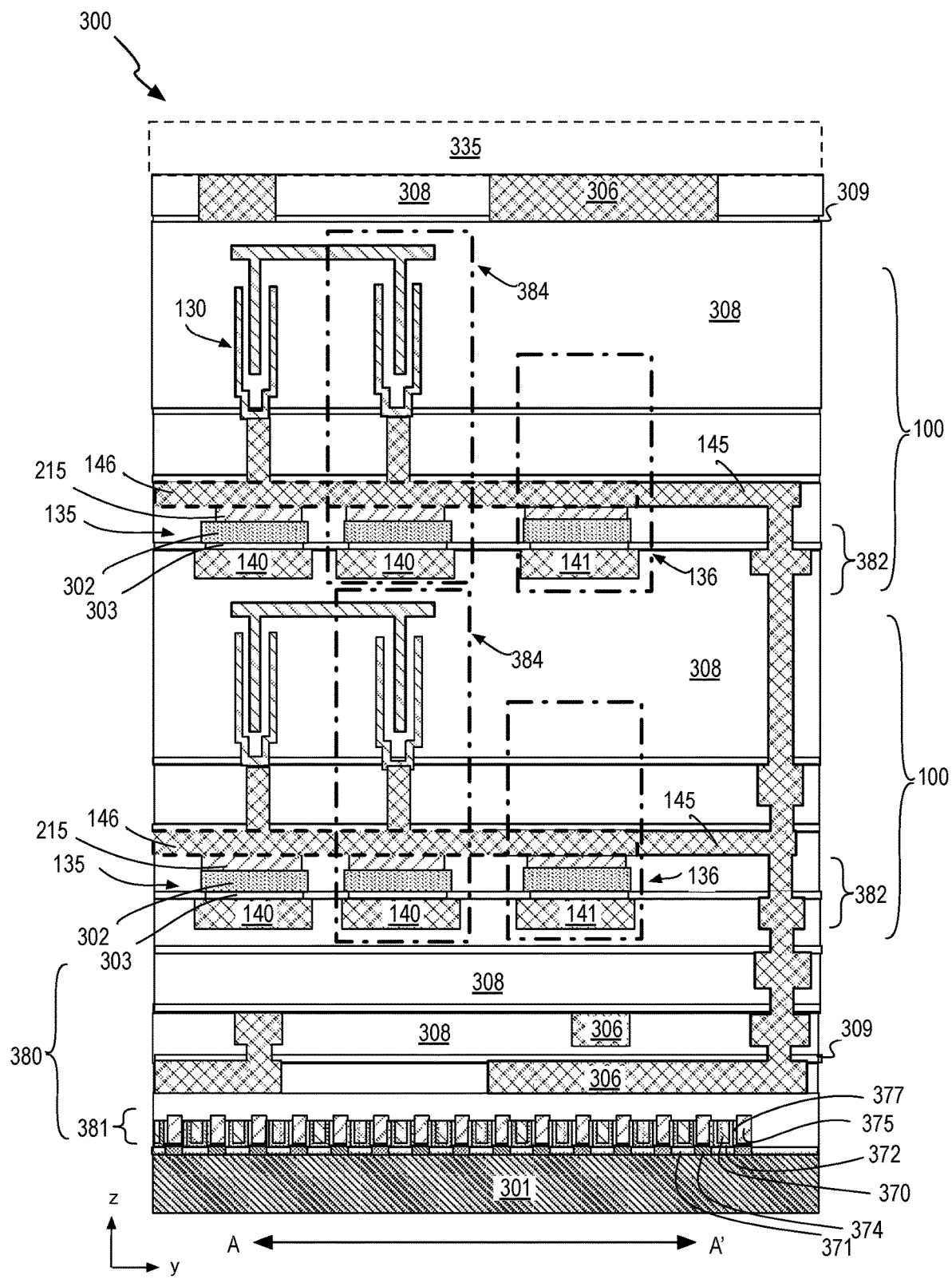
FIGS. 3A, 3B, and 3C illustrate cross-sectional views of a multi-layer DRAM device structure, in accordance with some embodiments.
Figure 3B:
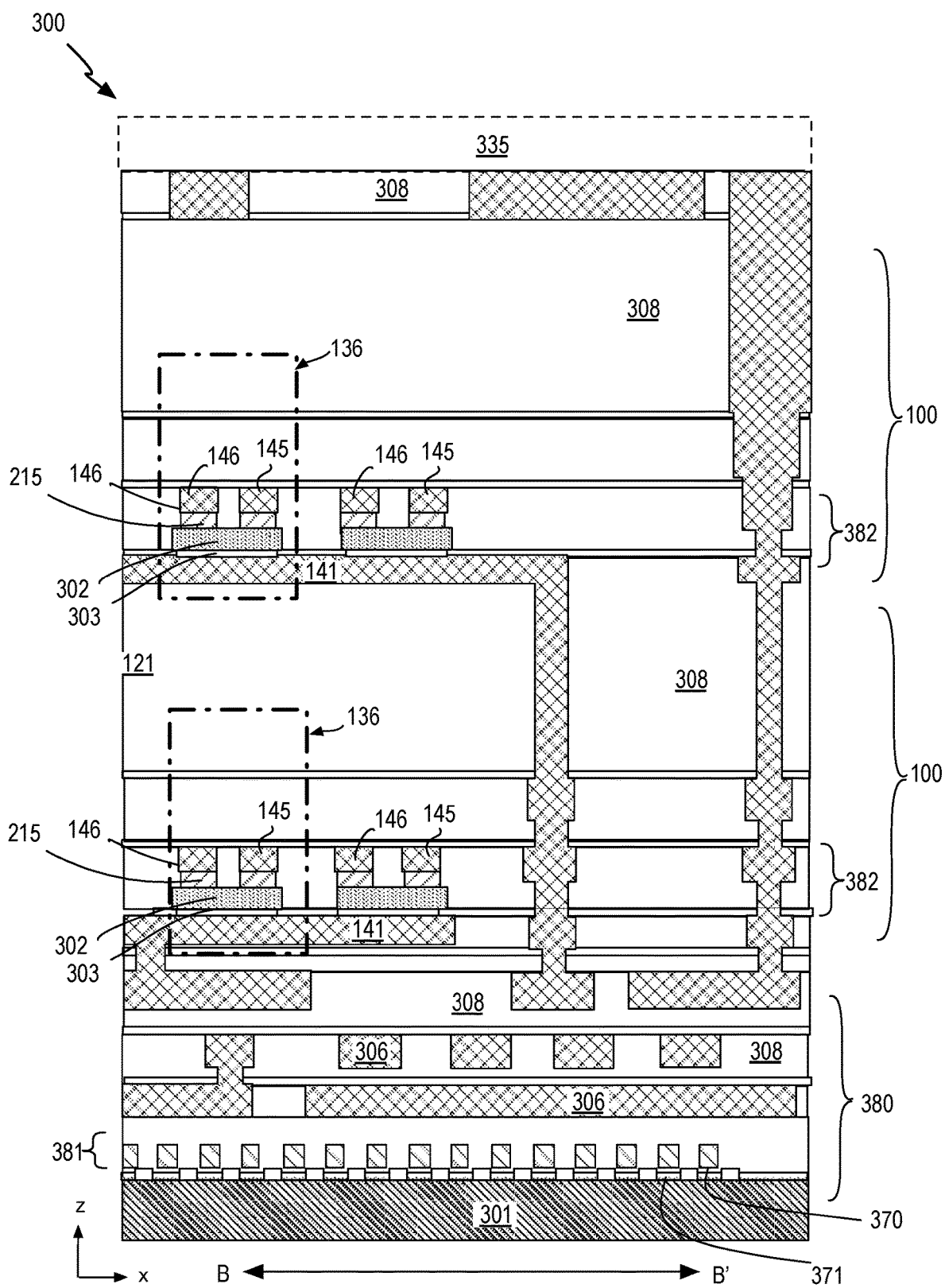
Figure 3C:
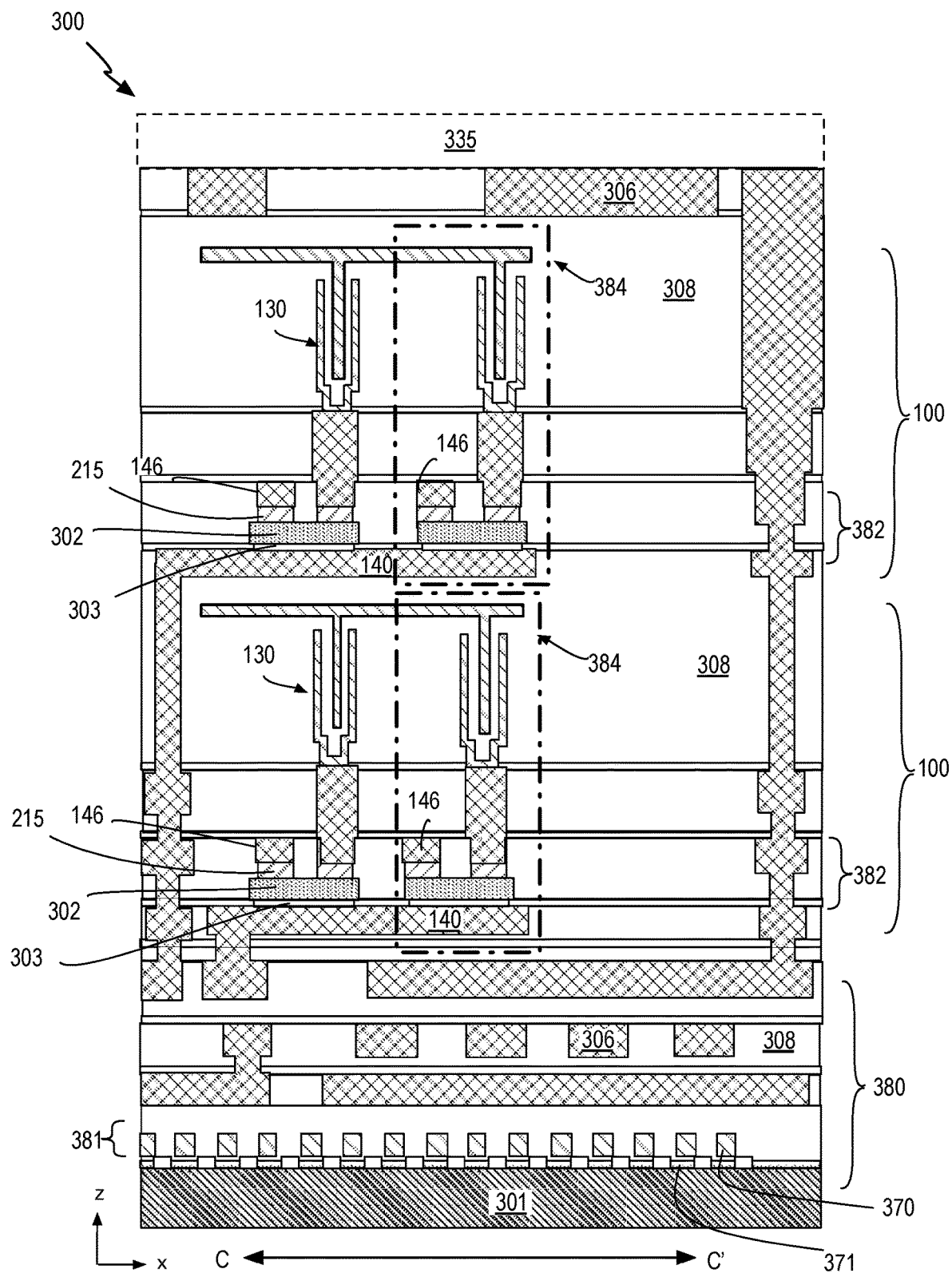

FIGS. 3A, 3B, and 3C illustrate cross-sectional side views of an IC structure 300 including multi-layer DRAM device 101, in accordance with some embodiments. IC structure 300 includes an exemplary implementation of the multi-layer memory array architecture introduced in FIG. 1. However, for clarity only two memory cell array levels 100 are illustrated in FIG. 3A-3C. Any number of additional memory cell array levels 100 may be fabricated within BEOL layers 335, illustrated in dashed line to emphasize there may be any number of additional device layers and/or metallization levels present within IC device structure 300. FIG. 3A is a sectional view orthogonal to a transistor gate direction along the dashed A-A' line shown in FIG. 2. FIG. 3B is a sectional view parallel to the transistor gate direction along the dashed B-B' line shown in FIG. 2. FIG. 3C is a sectional view parallel to the transistor gate direction along the dashed C-C' line shown in FIG. 2.

IC structure 300 depicts a portion of a monolithic IC including peripheral circuitry 380 fabricated over and/or on a substrate 301. Peripheral circuitry 380 includes a plurality of MOSFETs 381 that employ a monocrystalline semiconductor for at least the channel semiconductor 371. Peripheral circuitry 380 may further include one or more levels of interconnect metallization 306 embedded in dielectric material layers 308, 309. In the exemplary embodiment illustrated, peripheral circuitry 380 includes metal-one (M1), metal-two (M2) and metal-three (M3) interconnect metallization levels, but may include four or more such interconnect metallization levels.

A plurality memory cell array levels 100 are stacked over peripheral circuitry 380. 1T1C memory cells 384 are denoted by dot-dashed line in FIG. 3A-3C. Within one memory cell 384 there is a TFT 382 operable as a cell select transistor. Other TFTs 382 are operable as array level select transistors 136. Individual ones of cell select TFTs 382 include a gate terminal coupled to a wordline 140 while individual ones of layer select TFTs 382 include a gate terminal coupled to a layer select line 141.

As shown, all TFTs 382 of one memory cell array level 100 employ a semiconductor material 302. Semiconductor material 302 is separated from wordline 140 or layer select line 141 by a gate dielectric 303. In illustrated embodiment, wordline 140 and array layer select line 141 are in the same metallization level with TFTs 382 all being "bottom-gate" devices with semiconductor material 302 having been deposited over wordlines 140 and array layer select line 141. TFTs 382 can instead be top-gate devices, multi-gate devices (e.g., having both a top-gate and a bottom-gate), or sidewall-gated devices (e.g., a finFET) as embodiments herein are not limited in this respect.

Within the 1T1C cells 384, each capacitor 130 is above a corresponding cell select transistor 135. In the illustrated example, there is no capacitor 130 over layer select transistor 136. Alternatively, a dummy capacitor may be present over layer select transistor 136 if the dummy capacitor does not hinder interconnection of layer select transistor 136. As shown in FIG. 3A, interconnect metallization from peripheral circuitry 380 extends up through multiple levels of metallization and intersects global bitline 145 for multiple memory cell array levels 100. Layer select transistors 136 facilitate the illustrated stacked via routing between any number of memory cell array levels 100 and peripheral circuitry 380. In the absence the absence of select transistors 136, a separate route to peripheral circuitry 380 would be required for every bitline of every memory cell array level. Global bitline 145 is coupled with a layer-specific local bitline 146 that is illustrated with dashed line as being out of the sectional plane drawn in solid line. Each local bitline 146 is within the same metallization level as global bitline 145, with each bitline coupled to one terminal contact of layer select transistor 136.

FIG. 3B further illustrates an exemplary interconnection of memory cell array layer select transistors 136. As shown, adjacent layer select transistors 136 of one memory cell array layer 100 are coupled to layer select lines 141 that extend through multiple metallization levels to separate nodes within peripheral circuitry 380. Each circuit node may be connected to an output of a layer select line driver, for example. Hence, for each memory cell array layer, a different layer select line 141 is routed to peripheral circuitry 380.

FIG. 3C further illustrates an exemplary wordline staircase architecture for multi-layered cell select transistors 135. As shown, overlapping storage cell select transistors 135 of different memory cell array levels 100 have wordlines 140 that extend through multiple metallization levels to separate nodes within peripheral circuitry 380. For each memory cell array layer, a different world line 140 is routed to peripheral circuitry 380, for example to different word line drivers.

Semiconductor material 302 may be any thin film semiconductor material. In some embodiments, semiconductor material 302 is a group IV semiconductor material such as silicon (Si), germanium (Ge), and SiGe alloys. In other embodiments, semiconductor material 302 is a III-V semiconductor materials such as GaAs, InGaAs. In other embodiments, semiconductor material 302 is a III-N semiconductor material such as GaN. In other embodiments, semiconductor material 302 is an oxide semiconductor material. In other embodiments, semiconductor material 302 is a metal chalcogenide semiconductor material. TFT performance depends on the composition of the semiconductor employed as the transistor channel material. This is particularly important for layer select transistors 136, which are in electrical series with bitlines so that capacitance, leakage, and resistance parameters of the TFT are all important. In some advantageous embodiments therefore, semiconductor material 302 is a semiconductor comprising oxygen and/or a chalcogen. Some exemplary oxide semiconductors include $ZnO_x$, $InO_x$, InZnO, $InGaZnO_x$, $InSnO_x$, $SnO_x$ and $CuO_x$ where x may range between 0.4 and 2. While the range of x may be expanded, semiconducting properties may be lost (e.g., the material becomes a pure conductor if x is to low, and a pure insulator if x is too high). Some exemplary chalcogenide semiconductors include $InSe_x$, $InS_x$, $ZnS_x$, $ZnSe_x$, $MoSe_x$, $MoS_x$, $CuS_x$, $CuSe_x$, $ZnN_x$, $HfS_x$, $HfSe_x$, ZrSx, $ZrSe_x$, $AlS_x$, or $AlSe_x$ where x may range between 0.4 and 2). In still other embodiments, semiconductor material 302 is black phosphorus or graphene. In many of these advanced materials, particularly oxide semiconductors, the minority carrier population is small compared to that of materials such as silicon and germanium, making the TFT an exclusively majority carrier device. With essentially no minority carriers, majority-minority carrier recombination cannot generate significant off-state leakage current. With low-leakage, global bitlines 145 may be well-isolated by array level select transistor 136 from non-selected local bitlines 146, for example.

Semiconducting properties of vary with microstructure, and semiconductor material 302 can be amorphous (i.e., having no structural order), or polycrystalline (e.g., having micro-scale to nano-scale crystal grains), or event monocrystalline. Semiconductor material 302 may be a p-type, n-type, or intrinsic material. In exemplary embodiments, semiconductor material 302 is n-type as a number of oxide semiconductors and metal chalcogenides, for example, have been found to be capable of significant electron densities. Some oxide semiconductors and metal chalcogenides have also been found to be capable of significant electron hole densities. Although not bound by theory, the basis for semi-conductivity in many oxide semiconductors may be the presence of oxygen vacancies. The presence of other electrically active dopants, such as hydrogen, or one or more metal species, may also serve as a means of tuning the semiconducting properties of the oxide semiconductor. Semiconductor material 302, may be intentionally doped, or not. Compared to intrinsic semiconductor that is not intentionally doped, n-type and p-type semiconductors may have a higher concentration of impurities, such as, but not limited to, one or more group III element, group V element, and/or elemental hydrogen (H), and/or oxygen vacancies. Dopant levels in semiconductor material 302 may be selected to arrive at an optimal threshold voltage associated with gating the oxide semiconductor within the channel and/or for lowest bulk and/or junction resistance within the source/drain region.

Gate dielectric 303 may be any dielectric known to be suitable for TFTs. In some embodiments, gate dielectric 303 is a high-K material having a bulk permittivity exceeding 9. In some exemplary embodiments, gate dielectric 303 comprises one or more layer of metal oxide or metal nitride, such as $HfO_2$, BN, AlN, HfN, ZrN, YN, $Al_2O_3$, $ZrO_2$, $Y_2O_3$, $Ta_2O_5$, or $TiO_2$. In other embodiments, gate dielectric 303 is of a moderate-K material have a bulk permittivity below 9. In some exemplary embodiments, gate dielectric 303 comprises one or more layer of $SiO_2$, SiN, or SiON.

Contacts 215 may have any composition known to provide a suitable contact to semiconductor layer 302. Contacts 215 may form a schottky or ohmic junction with an interface of semiconductor layer 302. Contact 215 may include, for example, one or more metals (e.g., Ti, Cu, Ta, Co, Ni, Pt, Pd, or Al) or metallic compounds. In some embodiments, contact 215 includes a metal nitride at the interface of (i.e., in direct contact with) semiconductor layer 302. Exemplary metal nitrides include TiN, TaN, and WN.

As further illustrated in FIG. 3A-3C, FETs 381 include a gate terminal 370 separated from channel semiconductor 371 by a gate dielectric 372. Channel semiconductor 371 separates semiconductor terminals 374 (source semiconductor and drain semiconductor). Contact metallization 375 lands on semiconductor terminals 374 and is separated from gate terminal 370 by an intervening dielectric spacer 377. FETs 381 may include any materials formed by any additive and/or substrate techniques known to be suitable for fabricating FETs. FETs 381 may be planar or non-planar devices, for example. In some advantageous embodiments, FETS 381 are finFETs. FETs 381 may include one or more semiconductor materials. As one example, FETs 381 employ a surface layer of a substantially monocrystalline substrate 301. Substrate 301 may be any material known to be suitable for the fabrication of MOSFET (CMOS) circuitry, such as, but not limited to, group IV materials (e.g., silicon, germanium, and SiGe). Gate dielectric 372 may be any of the materials described above for gate dielectric 303.

In some embodiments, in addition to implementing peripheral circuitry 380, FETs 381 may further comprise CMOS logic circuitry of an applications processor or central processing unit (CPU). For such embodiments, IC structure 300 is a system-on-chip (SOC) that includes embedded DRAM (eDRAM) having one or more of the features described above.

The IC device structures described herein may be fabricated according to any suitable techniques. Fabrication may utilize any substrate, such as one including a monocrystalline semiconductor layer (e.g., a silicon layer) upon which FETs may be formed. FETs may be fabricated upon the substrate material using any known technique and then interconnected with BEOL metallization levels to form peripheral CMOS circuitry comprising both n-type and p-type FETs. Multiple memory cell array layers, each including cell select and array level TFTs and MIM capacitors, are then fabricated within BEOL metallization levels over the front-end FET circuitry. The TFTs are interconnected to the MIM capacitors with traces fabricated at these same BEOL metallization levels to form levels of a 3D memory array.

Fabrication of the TFT layers may comprise any of physical vapor deposition (PVD), chemical vapor deposition (CVD), e-beam deposition (EBD), or pulsed laser deposition (PLD) to deposit a thin film of semiconductor material, for example. Any of the materials described above may be deposited as a blanket layer over the substrate. The semiconductor layer may then be patterned, for example with any known lithographic mask patterning process followed by any semiconductor etch process known to be suitable for the semiconductor material. Alternatively, selective deposition techniques may form semiconductor material within localized areas of a substrate.

Figure 4:
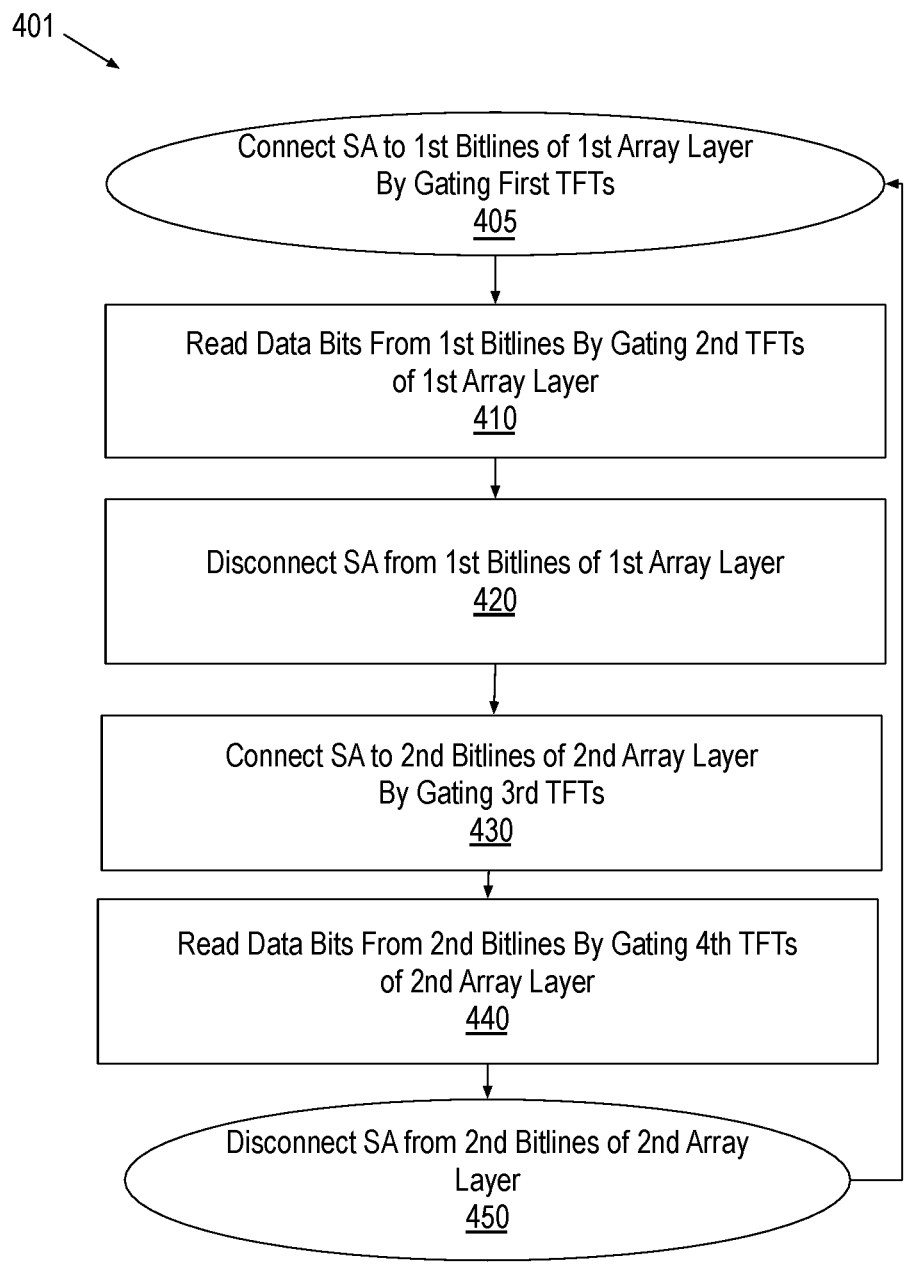
FIG. 4 is a flow diagram illustrating a method of reading data from a multi-layered memory array, in accordance with some embodiments.

FIG. 4 is a flow diagram illustrating methods 401 for reading data from a multi-layered memory array, in accordance with some embodiments. Methods 401 begin at block 405 where sense amplifier circuitry is connect to bitlines of a first array layer by appropriately gating the layer select transistor of the first array layer. For example, a plurality of memory cell sense amplifiers may be connected to a plurality of first bitlines of a memory cell array level by applying a voltage to a gate terminal of a layer select TFTs that each have a first of their source/drain terminals connected to one of the first bitlines and a second of their source/drain terminals connected to one of the sense amplifiers.

Methods 401 continue at block 410 where the sense amplifier circuitry reads data bits from the bitlines connected to the sense amplifiers. For examples, data may be read from one or more of the first bitlines by applying a voltage to a gate terminal of cell select TFTs (e.g., through a bitline precharing and wordline charging) in the first memory cell array level.

Methods 401 continue at block 420 where the sense amplifier circuitry is disconnected from the bitlines in the first array layer so that they may be next coupled to a different array layer. For example, the plurality of memory cell sense amplifiers may be disconnected from the plurality of first bitlines of the first memory cell array layer by removing, or reversing, the first voltage from the gate terminals of the first plurality TFTs.

Methods 401 continue at block 430 wherein the sense amplifier circuitry is connected to bitlines in a second array layer. For example, the plurality of memory cell sense amplifiers may be connected to a plurality of second bitlines of a second memory cell array layer by applying a voltage to a gate terminal of select TFTs in the second memory layer that each have a first of their source/drain terminals connected to one of the second bitlines and a second of their source/drain terminals connected to one of the sense amplifiers.

Methods 401 continue at block 440 where the sense amplifier circuitry reads data bits from one or more of the second bitlines of the second array level. For example, the plurality of sense amplifiers may read data from one or more of the second bitlines by applying a voltage to a gate terminal of cell select TFTs in the second memory cell array layer, for example by driving a first wordline of the second memory cell array layer.

Methods 401 continue at block 450 with disconnecting the plurality of memory cell sense amplifiers from the plurality of second bitlines of the second memory cell array level, for example by removing the voltage from the gate terminals layer select transistors in the second array layer.

Methods 401 may be repeated over any number of read cycles, and may further include any number of array layers (e.g., more than the two).

Figure 5:
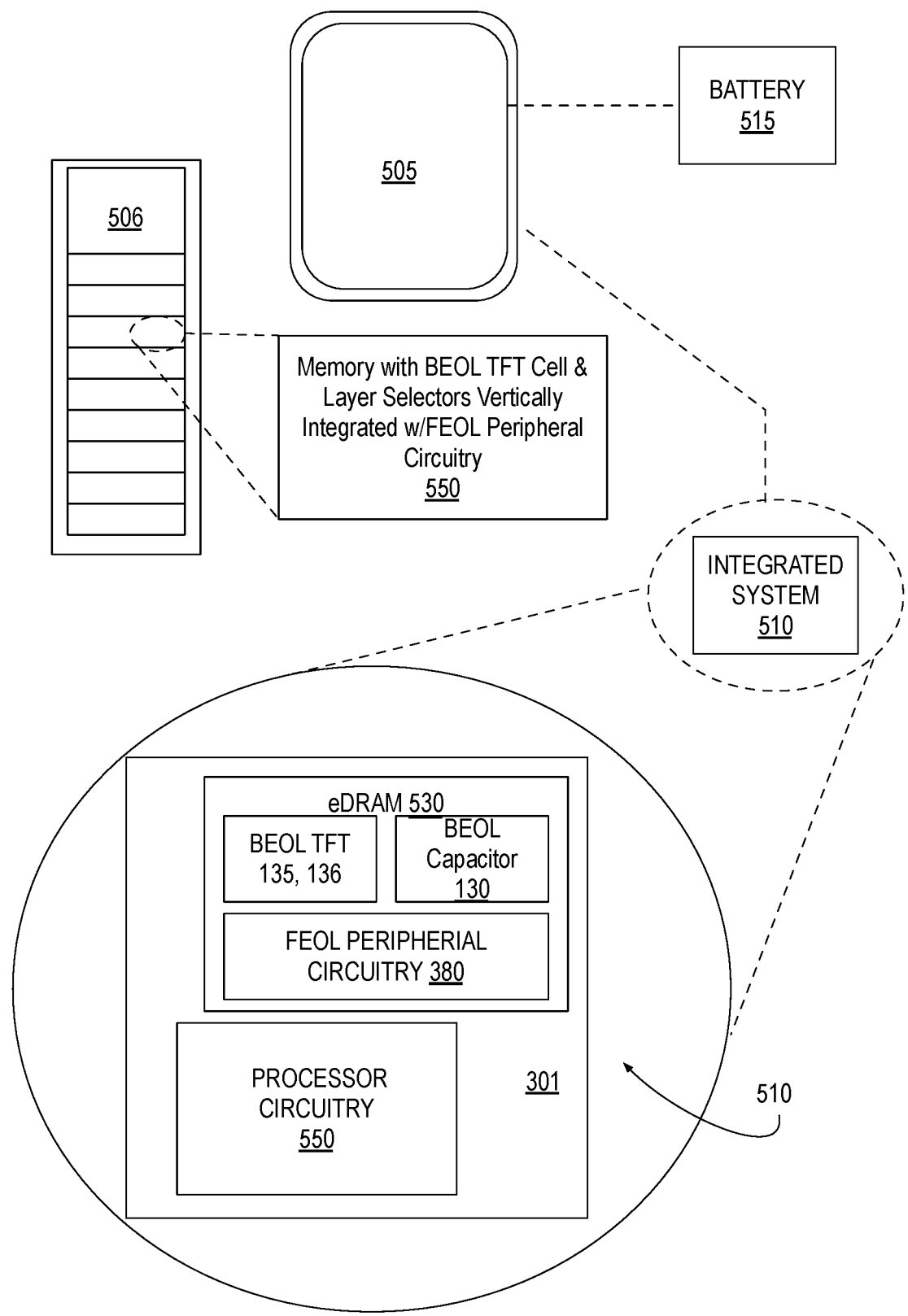
FIG. 5 illustrates a mobile computing platform and a data server machine including a multi-layer memory device with BEOL array level select transistors, in accordance with some embodiments.

FIG. 5 illustrates a mobile computing platform and a data server machine employing a multi-layer memory device 550 including BEOL TFTs that implement both memory cell select and memory cell array layer select functions, for example as described elsewhere herein. The server machine 506 may be any commercial server, for example including any number of high-performance computing platforms disposed within a rack and networked together for electronic data processing, which in the exemplary embodiment includes an IC with DRAM. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level integrated SOC 510, and a battery 515.

SOC 510 includes a single substrate 301 over which there is both processor circuitry 540 (e.g., a microprocessor, a multi-core microprocessor, graphics processor, or the like) and eDRAM 530. eDRAM 530 includes 1C-1TFT cells, with each cell including a BEOL TFT 135 and a BEOL capacitor 130, for example as described elsewhere herein. eDRAM 530 further includes BEOL TFT array layer select transistors 136, for example as described elsewhere herein. For exemplary embodiments, substrate 301 is a semiconductor chip. Processor circuitry 540, or a separate RFIC chip may be further coupled to an antenna (not shown) to implement any of a number of wireless standards or protocols, including but not limited to Wi-Fi (IEEE 1402.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 6:
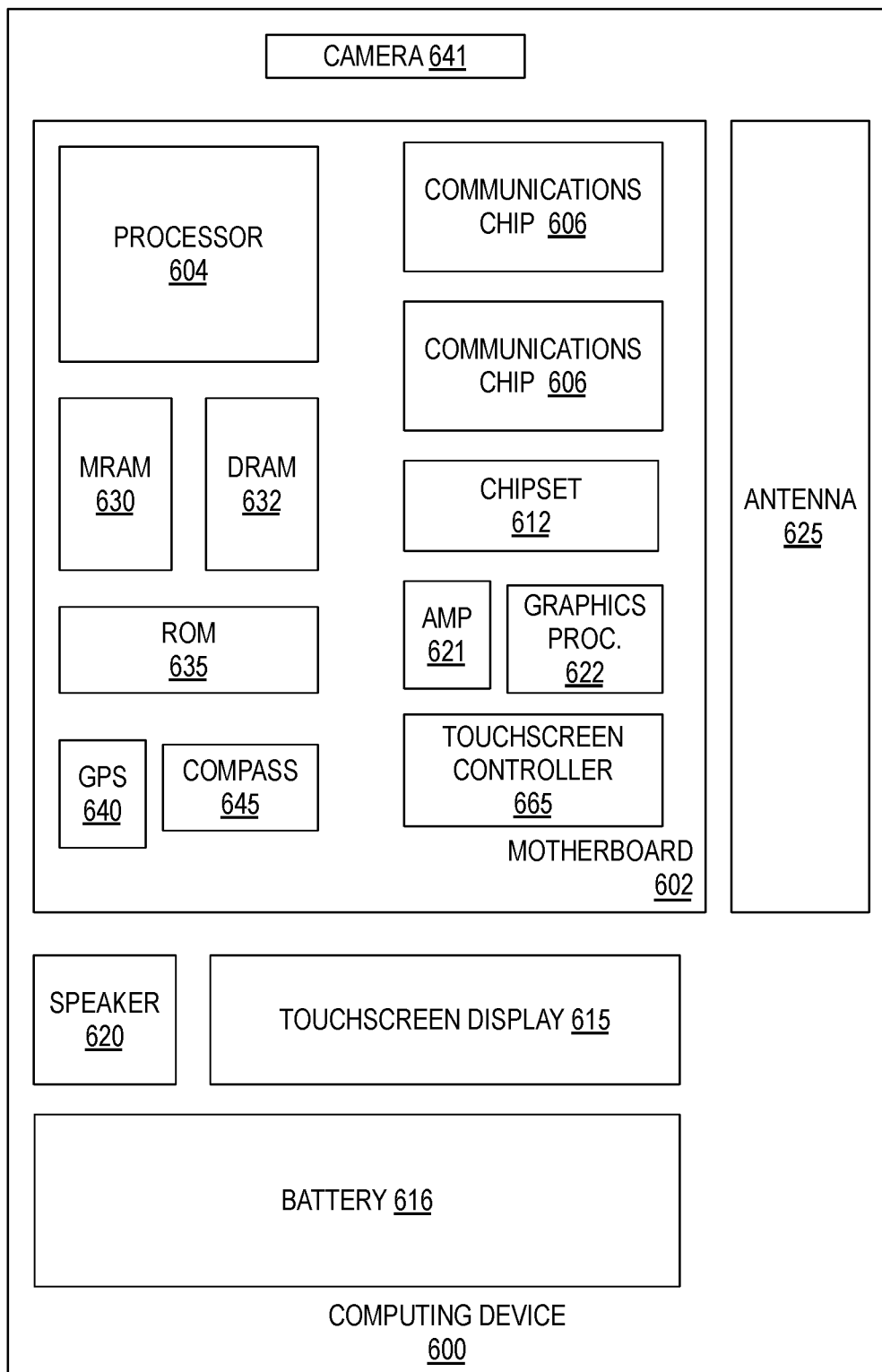
FIG. 6 is a functional block diagram of an electronic computing device, in accordance with some embodiments.

FIG. 6 is a functional block diagram of an electronic computing device, in accordance with some embodiments. Computing device 600 may be found inside platform 505 or server machine 506, for example. Device 600 further includes a motherboard 602 hosting a number of components, such as, but not limited to, a processor 604 (e.g., an applications processor). Processor 604 may be physically and/or electrically coupled to motherboard 602. In some examples, processor 604 includes an integrated circuit die packaged within the processor 604. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., DRAM 632), non-volatile memory (e.g., ROM 635), flash memory (e.g., NAND or NOR), magnetic memory (MRAM 630), a graphics processor 622, a digital signal processor, a crypto processor, a chipset 612, an antenna 625, touchscreen display 615, touchscreen controller 665, battery 616, audio codec, video codec, power amplifier 621, global positioning system (GPS) device 640, compass 645, accelerometer, gyroscope, speaker 620, camera 641, and mass storage device (such as hard disk drive, solid-state drive (SSD), compact disk (CD), digital versatile disk (DVD), and so forth), or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In first examples, an integrated circuit (IC) memory device comprises a sense amplifier comprising a first transistor including a first semiconductor material layer. The memory device comprises a first memory cell comprising a second transistor including a second semiconductor material layer, above the first semiconductor material layer. The memory device comprises a first bitline coupled to a first terminal of the second transistor. The memory device comprises a second memory cell comprising a third transistor including a third semiconductor material layer, above the second semiconductor material layer. The memory device comprises a second bitline coupled to a first terminal of the third transistor. The memory device comprises a fourth transistor including the second semiconductor material layer, the fourth transistor having a first terminal coupled to the first bitline, and a second terminal coupled to an input node of the sense amplifier. The memory device comprises a fifth transistor including the third semiconductor material layer, the fifth transistor having a first terminal coupled to the second bitline, and a second terminal coupled to the input node of the sense amplifier.

In second examples, for any of the first example the IC memory device further comprise a first layer select line coupled to a gate terminal of the fourth transistor, a second layer select line coupled to a gate terminal of the fifth transistor, and select line driver circuitry to set the first layer select line to a first voltage that connects the first bitline to the input node of the sense amplifier while the second layer select line is at a second voltage that disconnects the second bitline from the input node of the sense amplifier.

In third examples, for any of the second examples the select line driver circuitry is to set the second layer select line to the first voltage that connects the first bitline to the input node of the sense amplifier while the first layer select line is at the second voltage that disconnects the second bitline from the input node of the sense amplifier.

In fourth examples, for any of the first through third examples the sense amplifier is one of a plurality of sense amplifiers, each of the plurality of sense amplifiers having an input node. The first memory cell is one of a plurality of first memory cells, andthe second transistor is one of a plurality of second transistors including the second semiconductor material layer, and individual ones of the first memory cells include corresponding ones of the second transistors. The first bitline is one of a plurality of first bit lines. Each of the plurality of first bit lines is coupled to a first terminal of individual ones of the first memory cells. The fourth transistor is one of a plurality of fourth transistors including the second semiconductor material layer, each of the plurality of fourth transistors having a first terminal coupled to individual ones of the first bitlines, and a second terminal coupled to the input node of individual ones of the plurality of sense amplifiers. The first layer select line is coupled to a gate terminal of individual ones of the fourth transistors.

In fifth examples, for any of the fourth examples, the second memory cell is one of a plurality of second memory cells. The third transistor is one of a plurality of third transistors including the third semiconductor material layer, and individual ones of the second memory cells include corresponding ones of the third transistors. The second bitline is one of a plurality of second bit lines, each of the plurality of second bit lines coupled to a first terminal of individual ones of the second memory cells. The fifth transistor is one of a plurality of fifth transistors including the third semiconductor material layer, each of the plurality of fifth transistors having a first terminal coupled to individual ones of the second bitlines, and a second terminal coupled to the input node of individual ones of the plurality of sense amplifiers. The second layer select line is coupled to a gate terminal of individual ones of the fifth transistors.

In sixth examples, for any of the fourth through fifth examples the plurality of second transistors and the plurality of fourth transistors have the same pitch.

In seventh examples, for any of the first through sixth examples, a first wordline is coupled to a gate terminal of the second transistor. A first wordline driver circuitry is electrically coupled to the first wordline, and is to bias the first wordline to a predetermined voltage. A second wordline is coupled to a gate terminal of the third transistor. A second wordline driver circuitry is electrically coupled to the second wordline, and is to bias the second wordline to a predetermined voltage. A first capacitor is coupled to a second terminal of the second transistor. A second capacitor is coupled to a second terminal of the third transistor.

In eighth examples, for any of the seventh examples at least one of the select line driver circuitry or the wordline driver circuitry comprises transistors including the first semiconductor material layer.

In ninth examples, for any of the first through eighth examples at least one the second and third semiconductor material layers comprises a semiconductor material that includes oxygen or a chalcogen.

In tenth examples, for any of the ninth examples the semiconductor material comprises Si, Ge, $ZnO_x$, $SnO_x$, $CuO_x$, $InGaZnO_x$, $InSnO_x$, $InZnO_x$, InSe, InS, ZnS, ZnSe, MoSe, MoS, CuS, CuSe, ZrSe, AlS, or AlSe.

In eleventh examples, a computer platform includes microprocessor circuitry, and the IC memory of any of the first through tenth examples.

In twelfth examples, for any of the eleventh examples, the microprocessor circuitry comprises transistors including the first semiconductor layer.

In thirteenth examples, a DRAM device comprises a plurality of memory cell sense amplifiers comprising a plurality of field effect transistors (FETs), wherein individual ones of the FETs comprise a first semiconductor material layer. The DRAM device comprises a multi-layer memory cell array monolithically integrated with the memory cell sense amplifiers, each layer of the memory cell array including an array of thin film transistors (TFTs), a first of the TFTs electrically coupled bitlines local to that layer of the array, and a second of the TFTs electrically coupled to selectably connect individual ones of the sense amplifiers to corresponding bitlines in one of the memory cell array layers.

In fourteenth examples, for any of the thirteenth examples the multi-layer memory cell array comprises three or more TFT layers and three or more capacitor layers, the TFT layers and the capacitor layers over the first semiconductor material layer.

In fifteenth examples, for any of the thirteenth through fourteenth examples the first of the TFTs have gates electrically coupled one or more wordlines and a source or drain coupled to the bitlines. The second of the TFTs have gates electrically coupled one or more layer select lines, individual ones of the layer select lines coupled to select line driver circuitry to vary the layer select line between a first voltage that connects bitlines to the sense amplifiers and a second voltage that disconnects bitlines from the sense amplifiers.

In sixteenth examples, for any of the thirteenth through fifteenth examples each layer of the memory cell array further comprises a capacitor array, individual ones in the capacitor array coupled to a terminal of the first of the TFTs.

In seventeenth examples, for any of the thirteenth through sixteenth examples, the first of the TFTs and the second of the TFTs have the same pitch.

In eighteenth examples, for any of the thirteenth through seventeenth examples, the TFTs include a channel comprising Si, SiGe, $ZnO_x$, $SnO_x$, $CuO_x$, $InGaZnO_x$, $InSnO_x$, $InZnO_x$, InSe, InS, ZnS, ZnSe, MoSe, MoS, CuS, CuSe, ZrSe, AlS, or AlSe.

In nineteenth examples, a method of operating an IC memory device comprises connecting a plurality of memory cell sense amplifiers to a plurality of first bitlines of a first memory cell array level by applying a first voltage to a gate terminal of a first plurality of thin film transistors (TFTs) that each have a first of their source/drain terminals connected to one of the first bitlines and a second of their source/drain terminals connected to one of the sense amplifiers. The method comprises reading data from one or more of the first bitlines by applying a second voltage to a gate terminal of a second plurality of thin film transistors (TFTs) in the first memory cell array level. The method comprises connecting the plurality of memory cell sense amplifiers to a plurality of second bitlines of a second memory cell array level by applying the first voltage to a gate terminal of a third plurality of thin film transistors (TFTs) that each have a first of their source/drain terminals connected to one of the second bitlines, and a second of their source/drain terminals connected to one of the sense amplifiers. The method comprises reading data from one or more of the second bitlines by applying the second voltage to a gate terminal of a fourth plurality of thin film transistors (TFTs) in the second memory cell array level.

In twentieth examples, for any of the nineteenth examples the method comprises disconnecting the plurality of memory cell sense amplifiers from the plurality of first bitlines of the first memory cell array level by removing the first voltage from the gate terminals of the first plurality TFTs. The method comprises disconnecting the plurality of memory cell sense amplifiers from the plurality of second bitlines of the second memory cell array level by removing the first voltage from the gate terminals of the second plurality of TFTs.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) memory device, comprising:
   a sense amplifier comprising a first transistor including a first semiconductor material layer;
   a first memory cell comprising a second transistor including a second semiconductor material layer, above the first semiconductor material layer;
   a first bitline coupled to a first terminal of the second transistor;
   a second memory cell comprising a third transistor including a third semiconductor material layer, above the second semiconductor material layer;
   a second bitline coupled to a first terminal of the third transistor;
   a fourth transistor including the second semiconductor material layer, the fourth transistor having a first terminal coupled to the first bitline, and a second terminal coupled to an input node of the sense amplifier;
   a fifth transistor including the third semiconductor material layer, the fifth transistor having a first terminal coupled to the second bitline, and a second terminal coupled to the input node of the sense amplifier.

2. The IC memory device of claim 1, further comprising:
   a first layer select line coupled to a gate terminal of the fourth transistor;
   a second layer select line coupled to a gate terminal of the fifth transistor; and
   select line driver circuitry to set the first layer select line to a first voltage that connects the first bitline to the input node of the sense amplifier while the second layer select line is at a second voltage that disconnects the second bitline from the input node of the sense amplifier.

3. The IC memory device of claim 2, wherein the select line driver circuitry is to set the second layer select line to the first voltage that connects the first bitline to the input node of the sense amplifier while the first layer select line is at the second voltage that disconnects the second bitline from the input node of the sense amplifier.

4. The IC memory device of claim 2, wherein:
   the sense amplifier is one of a plurality of sense amplifiers, each of the plurality of sense amplifiers having an input node;

the first memory cell is one of a plurality of first memory cells;

the second transistor is one of a plurality of second transistors including the second semiconductor material layer, and individual ones of the first memory cells include corresponding ones of the second transistors;

the first bitline is one of a plurality of first bitlines, each of the plurality of first bitlines coupled to a first terminal of individual ones of the first memory cells;

the fourth transistor is one of a plurality of fourth transistors including the second semiconductor material layer, each of the plurality of fourth transistors having a first terminal coupled to individual ones of the first bitlines, and a second terminal coupled to the input node of individual ones of the plurality of sense amplifiers; and the first layer select line is coupled to a gate terminal of individual ones of the fourth transistors.

5. The IC memory device of claim 4, wherein:

the second memory cell is one of a plurality of second memory cells;

the third transistor is one of a plurality of third transistors including the third semiconductor material layer, and individual ones of the second memory cells include corresponding ones of the third transistors;

the second bitline is one of a plurality of second bit lines, each of the plurality of second bit lines coupled to a first terminal of individual ones of the second memory cells;

the fifth transistor is one of a plurality of fifth transistors including the third semiconductor material layer, each of the plurality of fifth transistors having a first terminal coupled to individual ones of the second bitlines, and a second terminal coupled to the input node of individual ones of the plurality of sense amplifiers; and the second layer select line is coupled to a gate terminal of individual ones of the fifth transistors.

6. The IC memory device of claim 4, wherein the plurality of second transistors and the plurality of fourth transistors have the same pitch.

7. The IC memory device of claim 2, wherein:

a first wordline is coupled to a gate terminal of the second transistor;

a first wordline driver circuitry is electrically coupled to the first wordline, and is to bias the first wordline to a predetermined voltage;

a second wordline is coupled to a gate terminal of the third transistor;

a second wordline driver circuitry is electrically coupled to the second wordline, and is to bias the second wordline to a predetermined voltage;

a first capacitor is coupled to a second terminal of the second transistor; and a second capacitor is coupled to a second terminal of the third transistor.

8. The IC memory device of claim 7, wherein at least one of the select line driver circuitry or the wordline driver circuitry comprises transistors including the first semiconductor material layer.

9. The IC memory device of claim 1, wherein at least one the second and third semiconductor material layers comprises a semiconductor material that includes oxygen or a chalcogen.

10. The IC memory device of claim 1, wherein the semiconductor material comprises silicon, germanium, silicon-germanium, $ZnO_x$, $SnO_x$, $CuO_x$, $InGaZnO_x$, (IGZO), $InSnO_x$ (ITO), $InZnO_x$, (IZO), InSe, InS, ZnS, ZnSe, MoSe, MoS, CuS, CuSe, ZrSe, AlS, or AlSe.

11. A computer platform including:

microprocessor circuitry; and the IC memory device of claim 1.

12. The computer platform of claim 11, wherein the microprocessor circuitry comprises transistors including the first semiconductor layer.

13. A DRAM device, comprising:

a plurality of memory cell sense amplifiers comprising a plurality of field effect transistors (FETs), wherein individual ones of the FETs comprise a first semiconductor material layer; and a multi-layer memory cell array monolithically integrated with the memory cell sense amplifiers, each layer of the memory cell array including an array of thin film transistors (TFTs), a first of the TFTs electrically coupled to bitlines local to that layer of the array, and a second of the TFTs electrically coupled to selectably connect individual ones of the sense amplifiers to corresponding bitlines in one of the memory cell array layers.

14. The DRAM device of claim 13, wherein the multi-layer memory cell array comprises three or more TFT layers and three or more capacitor layers, the TFT layers and the capacitor layers over the first semiconductor material layer.

15. The DRAM device of claim 13, wherein:

the first of the TFTs have gates electrically coupled to one or more wordlines and a source or drain coupled to the bitlines; and the second of the TFTs have gates electrically coupled to one or more layer select lines, individual ones of the layer select lines coupled to select line driver circuitry to vary the layer select line between a first voltage that connects bitlines to the sense amplifiers and a second voltage that disconnects bitlines from the sense amplifiers.

16. The DRAM device of claim 13, wherein each layer of the memory cell array further comprises a capacitor array, individual ones in the capacitor array coupled to a terminal of the first of the TFTs.

17. The DRAM device of claim 13, wherein the first of the TFTs and the second of the TFTs have the same pitch.

18. The DRAM device of claim 13, wherein the TFTs include a channel comprising silicon, germanium, silicon-germanium, $ZnO_x$, $SnO_x$, $CuO_x$, $InGaZnO_x$, (IGZO), $InSnO_x$ (ITO), $InZnO_x$, (IZO), InSe, InS, ZnS, ZnSe, MoSe, MoS, CuS, CuSe, ZrSe, AlS, or AlSe.

19. A method of operating an IC memory device, the method comprising:

connecting a plurality of memory cell sense amplifiers to a plurality of first bitlines of a first memory cell array level by applying a first voltage to a gate terminal of a first plurality of thin film transistors (TFTs) in the first memory cell array level that each have a first of their source/drain terminals connected to one of the first bitlines and a second of their source/drain terminals connected to one of the sense amplifiers;

reading data from one or more of the first bitlines by applying a second voltage to a gate terminal of a second plurality of thin film transistors (TFTs) in the first memory cell array level;

connecting the plurality of memory cell sense amplifiers to a plurality of second bitlines of a second memory cell array level by applying the first voltage to a gate terminal of a third plurality of thin film transistors (TFTs) in the second memory cell array level that each have a first of their source/drain terminals connected to one of the second bitlines and a second of their source/drain terminals connected to one of the sense amplifiers; and reading data from one or more of the second bitlines by applying the second voltage to a gate terminal of a fourth plurality of thin film transistors (TFTs) in the second memory cell array level.

20. The method of claim 19, further comprising:

disconnecting the plurality of memory cell sense amplifiers from the plurality of first bitlines of the first memory cell array level by removing the first voltage from the gate terminals of the first plurality TFTs; and disconnecting the plurality of memory cell sense amplifiers from the plurality of second bitlines of the second memory cell array level by removing the first voltage from the gate terminals of the second plurality of TFTs.

* * * * *